United States Patent [19]
Cope et al.

[11] Patent Number: 5,463,328
[45] Date of Patent: Oct. 31, 1995

[54] EXPANDED PROGRAMMABLE LOGIC ARCHITECTURE

[75] Inventors: L. Todd Cope, San Jose; James A. Watson, Santa Clara, both of Calif.

[73] Assignee: Altera Corporation, San Jose, Calif.

[21] Appl. No.: 337,579

[22] Filed: Nov. 10, 1994

Related U.S. Application Data

[63] Continuation of Ser. No. 28,046, Mar. 8, 1993, abandoned.

[51] Int. Cl.$^6$ ............................................... H03K 19/177
[52] U.S. Cl. ............................................... 326/41; 326/44
[58] Field of Search .................... 340/825.79, 825.83, 340/825.87; 307/465, 465.1; 326/41, 44

[56] References Cited

U.S. PATENT DOCUMENTS

| | | | |
|---|---|---|---|
| 4,617,479 | 10/1986 | Hartmann et al. | 307/465 |
| 4,642,487 | 2/1987 | Carter | 307/465 |
| 4,871,930 | 10/1989 | Wong et al. | 307/465 |
| 5,151,623 | 9/1992 | Agrawal | 307/465 |
| 5,241,224 | 9/1993 | Pedersen et al. | 307/465 |

OTHER PUBLICATIONS

*Altera Data Book*, Sep. 1991, pp. 3–33 and 179–185.

*Primary Examiner*—Edward P. Westin
*Assistant Examiner*—Benjamin D. Driscoll
*Attorney, Agent, or Firm*—Townsend and Townsend and Crew

[57] ABSTRACT

A reprogrammable logic device and method of operation. The logic device is divided into a first hemisphere 101 and a second hemisphere 102. The first and second hemispheres of the arrays are internally connected by horizontal 20 and vertical 22 conductors. A global interconnect array 107 is placed between the hemispheres and is used to selectively connect the horizontal conductors of the hemispheres.

22 Claims, 5 Drawing Sheets

EXPANDED PROGRAMMABLE LOGIC ARCHITECTURE

This is a continuation of application Ser. No. 08/028,046, filed Mar. 8, 1993, now abandoned.

CROSS-REFERENCE TO RELATED APPLICATIONS

This application is related to application Ser. No. 08/088,973 (Attorney Docket No. 15114-373), filed on the same day as the present application, incorporated herein by reference for all purposes.

BACKGROUND OF THE INVENTION

The present invention relates to the field of programmable logic devices and methods of operation thereof. More specifically, in one embodiment the invention provides an improved architecture for programmable logic devices.

Programmable logic devices (PLDs), sometimes referred to as PALs, PLAs, FPLAs, PLDs, EPLDs, EEPLDs, LCAs, and FPGAs, are well know integrated circuits that provide the advantages of fixed integrated circuits with the flexibility of custom integrated circuits. Such devices allow a user to electrically program standard, off-the-shelf logic elements to meet the users specific needs. See, for example, U.S. Pat. No. 4,617,479, incorporated herein by reference for all purposes. Such devices are currently represented by, for example, Altera's MAX$^R$ series of PLDs and FLEX™ series of PLDs. The former are described in, for example, the Altera Data Book, September 1991, incorporated herein by reference. The latter are described in, for example, U.S. Ser. No. 07/880,942, filed May 8, 1992, and incorporated herein by reference for all purposes.

While meeting with substantial success, such devices have also met with some limitations. For example, it is desirable to increase the number of possible and alternative interconnection schemes between logical elements of such devices. Further, as the complexity of the functions becomes greater, it may become necessary to partition multiple logic chips in a single package.

From the above it is seen that improved programmable logic devices and methods of operation thereof are desired.

SUMMARY OF THE INVENTION

An improved programmable logic device and associated method of operating such device are provided by virtue of the present invention.

According to one aspect of the invention, a programmable logic device includes a plurality of logic modules (LMs) grouped together to form logic array blocks (LABs). The logic array blocks are arranged in rows. The rows are arranged in separate hemispheres that are interconnected by way of a programmable global interconnect array. The global interconnect array allows horizontal lines between the LABs in one hemisphere of the array to be interconnected to horizontal lines in the other hemisphere of the array.

The system herein provides an efficient way of increasing logic device density, and avoids the need to utilize multichip partitioning problems involved with the placement of several logic chips in a single package.

Accordingly, the invention herein provides a programmable memory device including a first array of reprogrammable logic units, the first array arranged in rows and columns to form a first hemisphere; a second array of reprogrammable logic units, the second array arranged in rows and columns to form a second hemisphere; a first set of horizontal conductors arranged along the rows of logic units in the first hemisphere, the first set of horizontal conductors selectively connectable to inputs or outputs of the logic units; a second set of horizontal conductors arranged along the rows of logic units in the second hemisphere, the second set of horizontal conductors selectively connectable to inputs or outputs of the logic units; a first set of vertical conductors arranged along the columns of logic units in the first hemisphere, the first set of vertical conductors selectively connectable to the first set of horizontal conductors; a second set of vertical conductors arranged along the columns of logic units in the second hemisphere, the second set of vertical conductors selectively connectable to the second set of horizontal inputs of the logic units; and a plurality of global interconnect conductors between the first and the second hemispheres, said global interconnect conductors selectively connectable to selected the first and the second horizontal conductors, whereby signals in the first hemisphere may be input to selected locations in the second hemisphere.

A further understanding of the nature and advantages of the inventions herein may be realized by reference to the remaining portions of the specification and the attached drawings.

DESCRIPTION OF THE PREFERRED EMBODIMENTS

Figure 1:
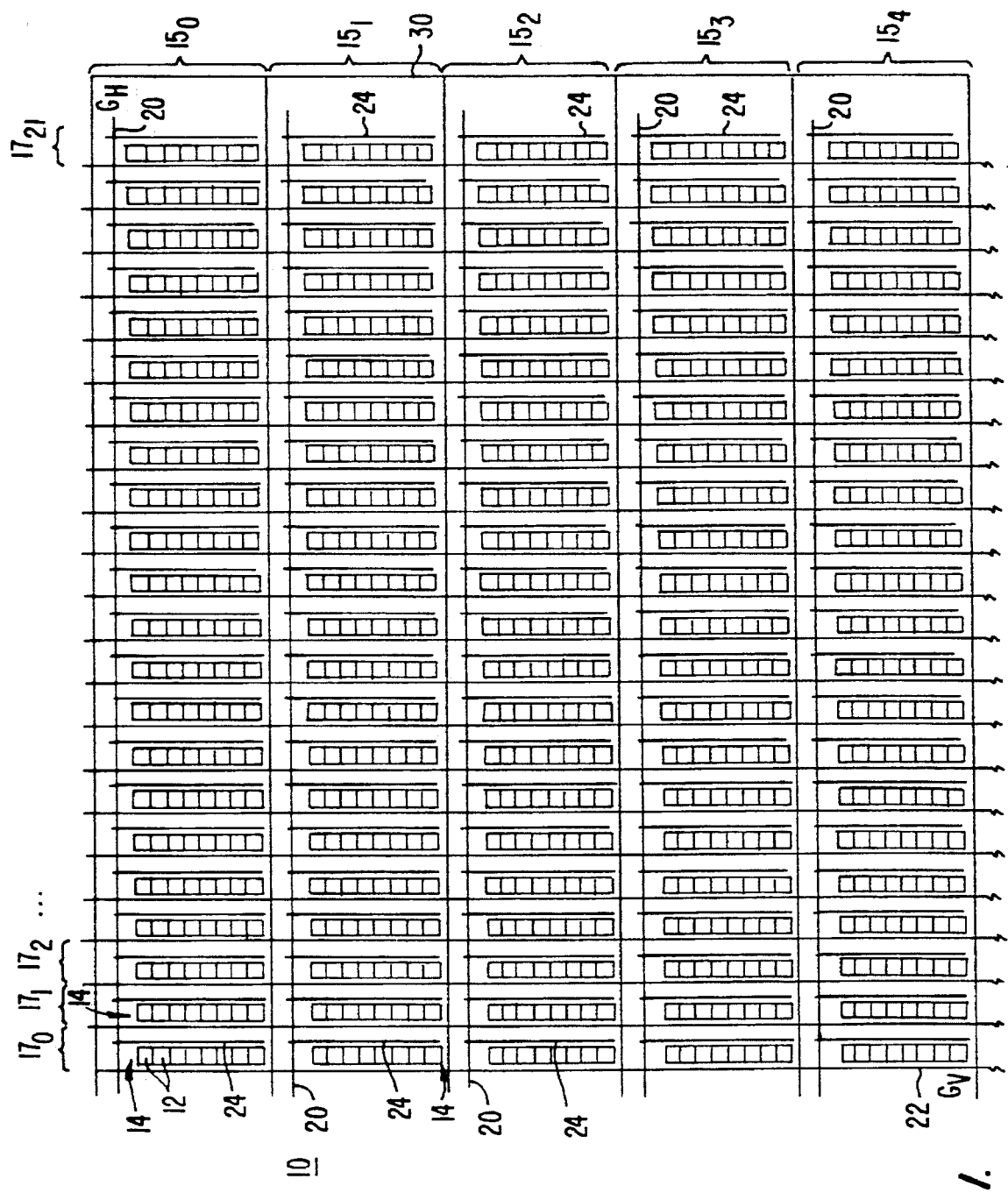
FIG. 1 is an illustration of a programmable logic device.

FIG. 1 illustrates a single hemisphere of programmable logic circuit 10. Not all of the conductors employed in circuit 10 are shown in FIG. 1, but enough is shown in this figure to begin the discussion. Each logic module (LM) 12 is represented by a small square in FIG. 1. Logic modules 12 are grouped together in groups of eight according to one aspect of the invention. Each of these groups is referred to as a logic array block or LAB 14. LABs 14 are preferably arranged in six horizontal rows $15_i$ (5 of which are shown) and 22 vertical columns $17_i$ on circuit 10. Accordingly, there are a total of 132 LABS 14 and 1056 logic modules 12 on circuit 10. Each logic module 12 is capable of performing a relatively elementry logic function, but extremely complex logic can be performed by selectively interconnecting the logic modules as will now be discussed.

The interconnection circuitry shown in FIG. 1 includes groups of so-called global horizontal conductors ($G_H$) 20 interspersed between the horizontal rows of LABs, and groups of global vertical conductors ($G_V$) 22 interspersed between the vertical columns of LABS. These conductors are preferably global in the sense that they extend along an entire row or column within a hemisphere of the device. Programmable interconnections can be made between intersecting horizontal and vertical conductors in order to apply signals on the vertical conductors to the horizontal conductors. Each LAB 14 has a group of vertical LAB input conductors 24 for conveying signals from the global horizontal conductors 20 intersected by conductors 24 to the logic modules 12 in that LAB.

In addition to the above-described conductors, FIG. 1 shows part of a network of so-called universal fast conductors. The conductors 30 of this network shown in FIG. 1 extend throughout the entire circuit and can be used as will be described in more detail below to convey widely used signals such as clock and/or clear signals to any logic modules 12 on the circuit.

Although other numbers of conductors can be used if desired, in the depicted preferred embodiment, there are 176 conductors in each group of global horizontal conductors 20, there are 16 conductors in each group of global vertical conductors 22, there are 24 conductors in each group of LAB input conductors 24, and there are four universal fast conductors 30.

Figure 2:
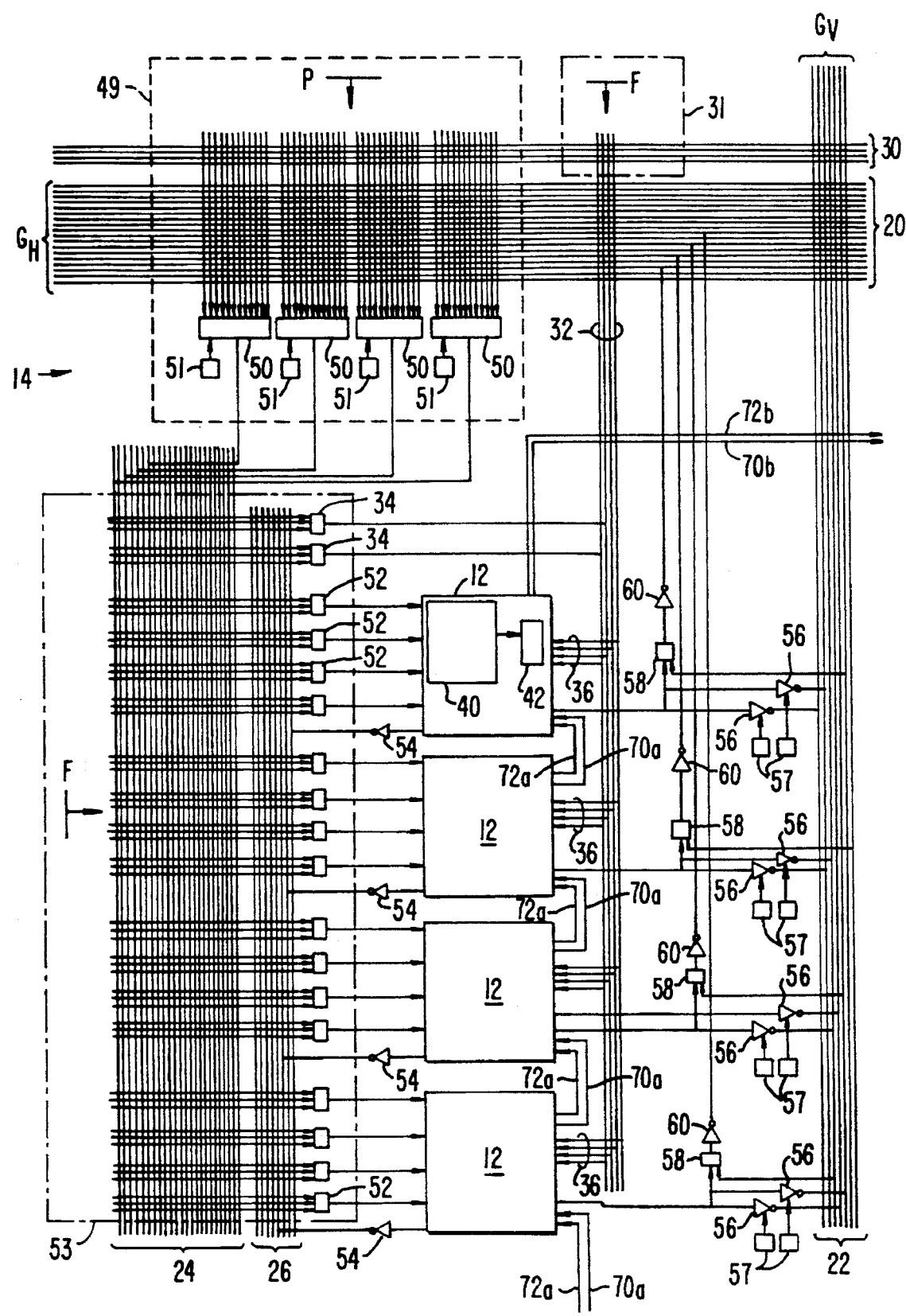
FIG. 2 illustrates portions of the programmable logic device shown in FIG. 1 in greater detail.

FIG. 2 shows part of a typical LAB 14. Four representative logic modules 12 are shown. Each logic module 12 includes a look-up table 40 and a flip-flop-type device 42. Each look-up table 40 is basically a circuit which can be programmed to produce an output signal that is any logical combination of four input signals applied to the look-up table. Each flip-flop 42 is a circuit which can be programmed either to store or to simply pass through the output signal of the associated look-up table.

In addition to the above-described representative logic modules, FIG. 2 shows portions of representative $G_H$ conductors 20, $G_V$ conductors 22, LAB input conductors 24, and universal fast conductors 30. Each of the LAB input conductors 24 can be connected to a selected one of conductors 20 and 30 via a programmably controlled switch 50 (only some of which are shown in FIG. 2). Although different sized switches 50 can be used if desired, in the preferred embodiment each switch 50 is a 15-to-1 switch that is controlled by programmable elements 51 (e.g., programmable or reprogrammable memory such as static memory cells) to connect one of its 15 inputs (only some of which are shown in FIG. 2) to its ouptut. Each of the 15 inputs is the signal on a predetermined respective one of conductors 20 or 30. There is one switch 50 for each of the 24 LAB input conductors 24. Each of conductors 20 and 30 is connected to two of switches 50. Accordingly, each of conductors 20 and 30 is connectable to two of conductors 24. The letter P and the associated arrow symbol inside dotted line 49 indicate that the population of connections from conductors 20 and 30 to the inputs of each of switches 50 is preferably a partial population.

Each of the four data inputs to each logic module 12 can be connected to any one of LAB input conductors 24 (or any one of local conductors 26) via a switch 52. Because there are 24 LAB input conductors 24 and eight local conductors 26, each of switches 52 is preferably a 32-to-1 switch. Accordingly, the letter F and the associated arrow symbol inside chain-dotted line 53 indicate that the population of connections from conductors 24 and 26 to switches 34 and 52 is a full population. In other respects switches 34 and 52 may be like switches 50 (i.e., each switch is programmably controlled to connect one of its inputs to its output; to avoid over-crowding the drawing, only a few representative inputs to each switch 52 are shown in FIG. 2).

The data output of the flip-flop 42 in each logic module 12 can be applied (via driver 54) to a respective one of local conductors 26. These conductors serve only the logic modules in the associated LAB 14. In other words, conductors 26 do not extend beyond the associate LAB. The data output of the flip-flop 42 in each logic model 12 can also be applied to either or both of two global vertical conductors 22 (via tri-state drivers 56), and to one of global horizontal conductors 20 (via a switch 58 and tri-state driver 60).

The second input to each switch 58 is the signal from a respective one of global vertical conductors 22. Accordingly, global vertical conductors 22 are selectively Connectable to global horizontal conductors 20 via switches 58 and tri-state drivers 60. The use of tri-state drivers 56 and 60 is advantageous to strengthen signals which may be required to travel relatively long distances throughout circuit 10 and/or which maybe inputs to relatively large numbers of other components. Tri-state drivers 56 and 60 are controlled (i.e, turned on or off) by programmable or reprogrammable elements (e.g., programmable random access memory ("RAM") such as SRAM elements 57) on circuit 10. Switches 58 are also controlled by programmable or reprogrammable elements (e.g., more RAM or SRAM cells) on the circuit.

In addition, to being available as data inputs to logic modules 12, the signals on any of conductors 24 and 26 can also or alternatively be applied to any of local vertical conductors 32 via 32-to-1 switches 34. Although only two such switches 34 are shown in FIG. 2, there is preferably one such switch for each of the four conductors 32. Each of conductors 32 is connectable to any one of universal fast conductors 30 for receiving the signal on the fast conductor. These connections from conductors 30 to conductors 32 are preferably made in the same way that the connections from conductors 24 and 26 to conductors 32 are made, i.e, by switches (not shown but preferably similar to switches 50), each of which can connect any of conductors 30 to an associated one of conductors 32. The letter F and the arrow symbol inside chain-dotted line 31 indicate that the population of possible connections from conductors 30 to each of conductors 32 is preferably a full population. Each of conductors 32 is connectable (via conductors 36) to each of logic modules 12. RAM-controlled switches in each logic module allow the signals to be used for such purposes as flip-flop clock and flip-flop clear in flip-flop 42. Thus local vertical conductors 32 are known as clock and clear lines and can be driven from fast lines 30 for synchronous clocks and clears (i.e., clocks and clears which come from outside of device 10 and are available everywhere throughout device 10), or from LAB input lines 24 or local lines 26.

Two other types of logic module interconnections are shown in FIG. 2. The first of these is carry-chain interconnection represented in part by conductors 70a and 70b. These interconnections allow a carry-out output of each logic module 12 to be used as a carry-in input to an adjacent or nearby logic module. For example, carry-chain conductors 70a allow the carry-out output of each logic module 12 shown in FIG. 2 to be the carry-in input to the next higher logic module in that figure. Similarly, carry-chain conductor 70b runs from the top-most logic module 12 in the LAB fragment shown in FIG. 2 to the bottom-most logic module in the horizontally adjacent LAB in the adjacent column of LABs. This allows the carry-chain to continue from LAB to LAB if desired.

The other type of logic module interconnection is illustated by representative conductors 72a and 72b in FIG. 2. These conductors are called cascade-connect conductors. They allow the data outputs of adjacent or nearby logic modules 12 to be logically combined, if desired, to perform more complex logic functions without the need to pass intermediate data through the general interconnection network.

Figure 3:
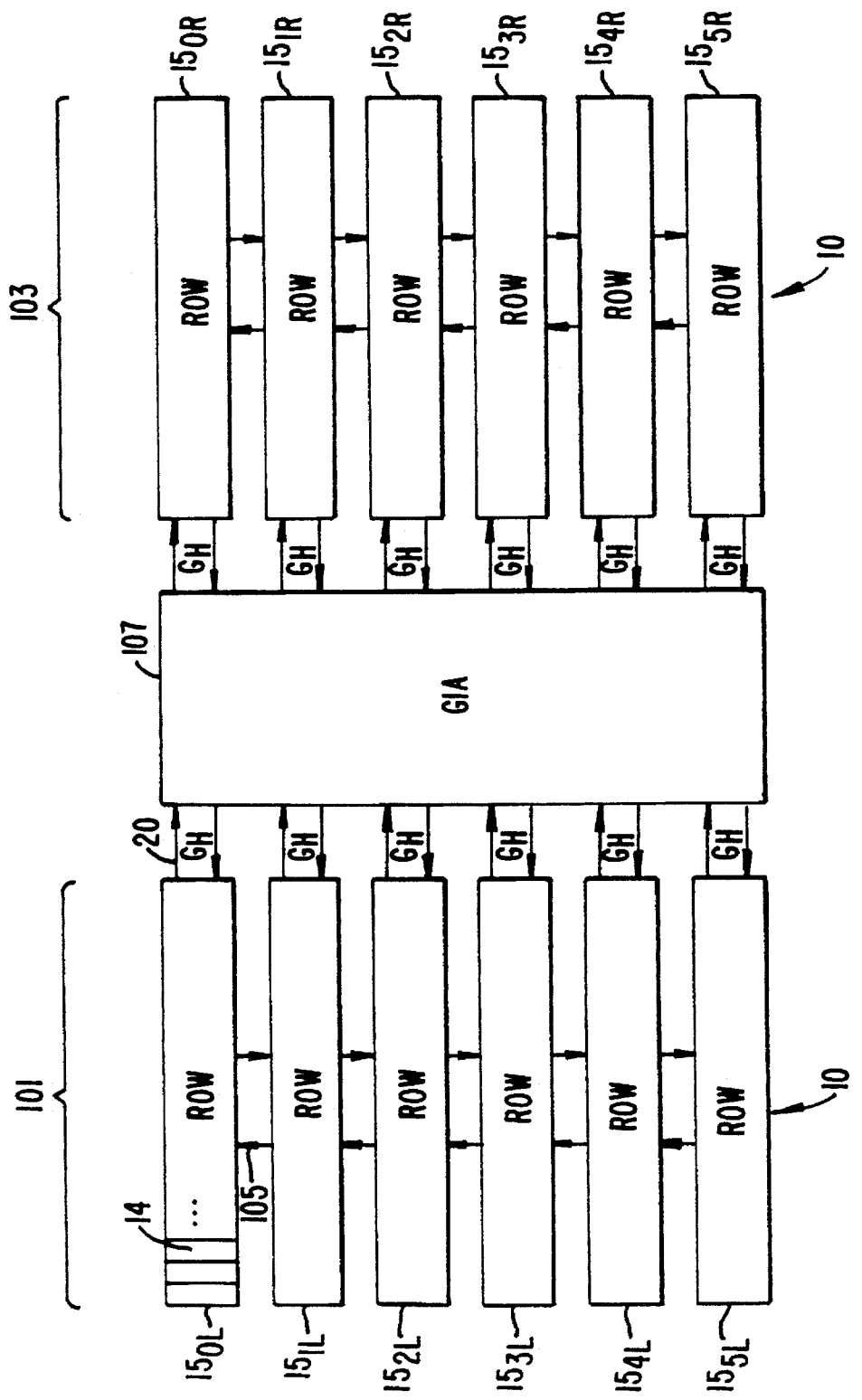
FIG. 3 illustrates a programmable logic device with a global interconnect array (GIA)

According to preferred embodiments of the invention, adjacent logic circuits 10 are placed on a single semiconductor substrate as hemispheres 101 and 103, as shown in FIG. 3. For example, hemisphere 101 includes logic circuit rows $15_{0L}$ to $15_{5L}$, while hemisphere 103 includes logic circuit rows $15_{0R}$ to $15_{5R}$. As with the circuit shown in FIGS. 1 and 2, communication 105 between rows within each hemisphere is made possible through selective connection of the various $G_H$ and $G_V$ conductors. In addition, a global interconnect array (GIA) 107 provides communication between the left and right hemispheres of the device. It is to be recognized that a device with two "hemispheres" is illustrated for purposes of simplicity, but a greater number of hemispheres may be utilized without departing from the scope of the invention herein.

As shown in FIG. 3, the GIA 107 interfaces the hemispheres through extensions of the $G_H$ conductors. Since each $G_H$ conductor is selectively connectable to $G_V$ conductors and other $G_H$ conductors within each hemisphere through appropriate programming of the various switches and tri-state buffers described above, it becomes apparent that the GIA also provides communication between the various $G_H$ and $G_V$ conductors of each hemisphere.

Figure 4:
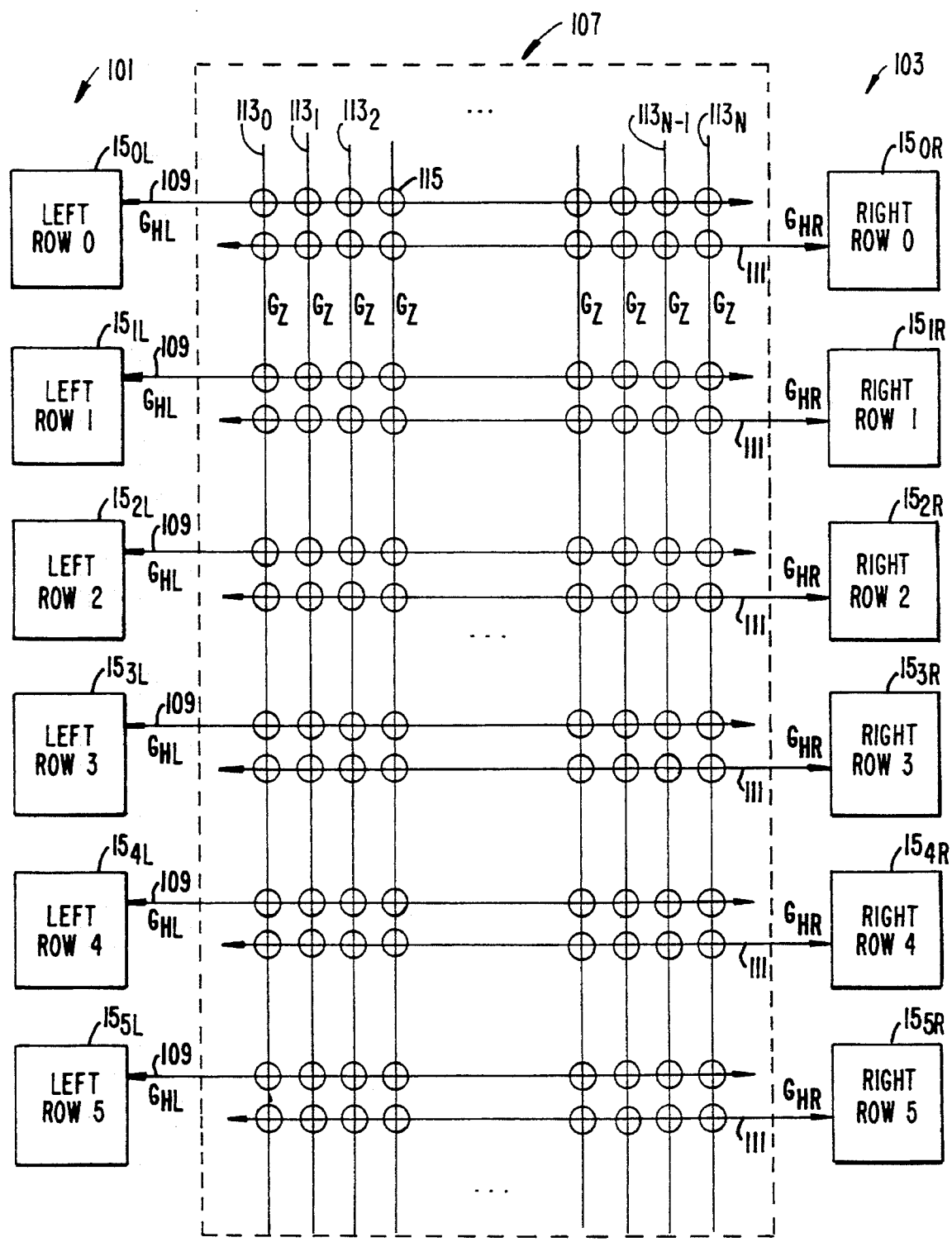
FIG. 4 illustrates the global interconnect array in greater detail.

FIG. 4 illustrates one embodiment of the GIA 107 in greater detail. As shown therein, the GIA utilizes horizontal extensions 109 of one or more (preferably all) of the $G_H$ lines from the left hemisphere 101 and horizontal extensions 111 of one or more (preferably all) of the $G_H$ lines from the right hemisphere 103. A single line is shown for simplicity. Intersecting lines $113_N$ (referred to herein as $G_Z$ lines) intersect horizontal extensions from both the left and right hemispheres. At the intersection of most or all of the horizontal extensions of the $G_H$ lines, a programmable cross-point switch 115 is provided. By appropriately programming the cross-point switches 115, a user may effectively connect any $G_H$ line in the left hemisphere with any other $G_H$ line in the right hemisphere or, additionally, the various $G_H$ lines within a hemisphere. Accordingly, the device will, effectively, provide the equivalent of two programmable logic devices on a single chip with programmable connections therebetween. As shown therein, in preferred embodiments, the GIA provides interconnection between the two hemispheres, but does not provide connections to input/output blocks on the device, unlike the $G_H$ and $G_V$ lines, which may be selectively coupled to I/O pins.

According to some embodiments, each of the cross-points between the extensions of the $G_H$ lines and the $G_Z$ lines provides a selective connection between the $G_H$ lines and the $G_Z$ lines through, for example, an EPROM or EEPROM switch. According to some embodiments of the invention, however, chip size is controlled by making only selected $G_H$ lines available as inputs to the various $G_Z$ lines. Details of such arrangements are discussed in U.S. Ser. No. 691,640, filed Apr. 25, 1991, incorporated above by reference. A simplified illustration of this arrangement is shown in FIG. 5.

Figure 5:
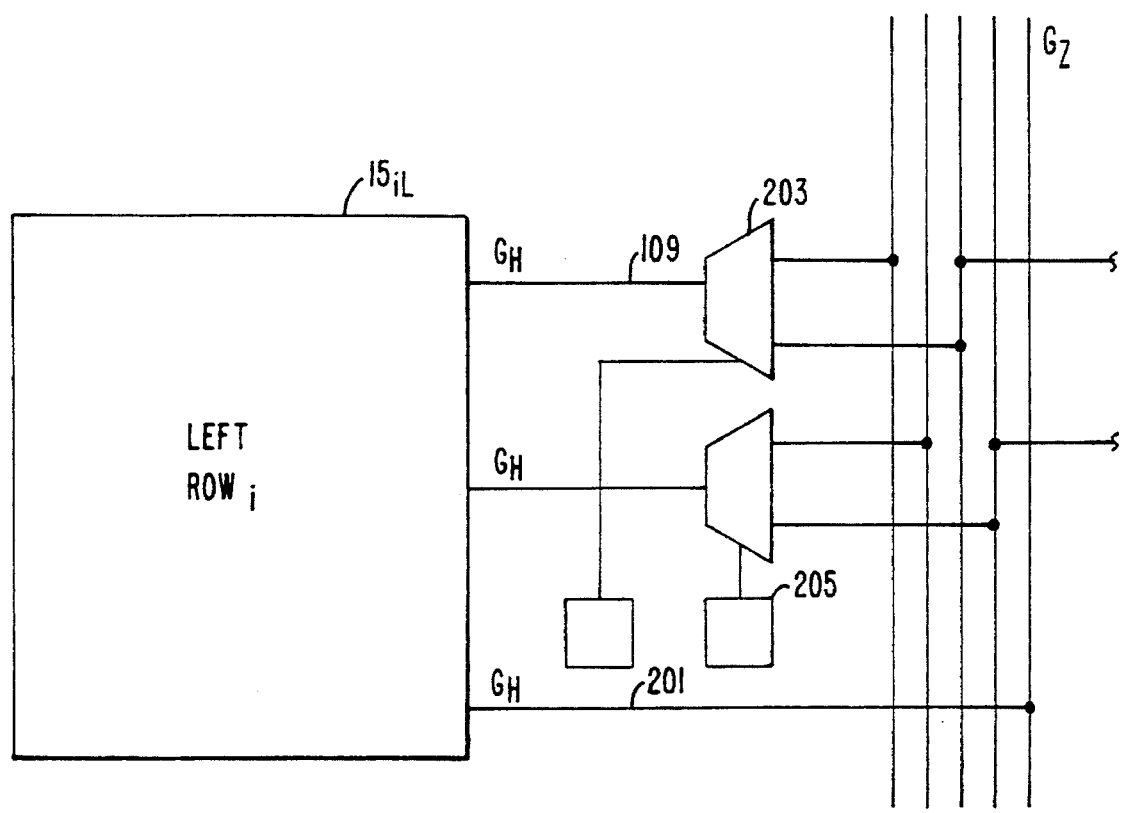
FIG. 5 illustrates portions of a GIA in greater detail.

As shown in FIG. 5, selected $G_H$ lines such as output line 201 are connected to $G_Z$ lines. Conversely, the inputs to multiplexers 203 are taken only from a portion of the $G_Z$ lines. Based on the values stored in memory 205, such as a static latch, the multiplexers 203 select various inputs for the $G_H$ lines from the $G_Z$ lines. Through such arrangements, a proper balance of interconnection flexibility, power consumption, and device size may be achieved.

Figure 6:
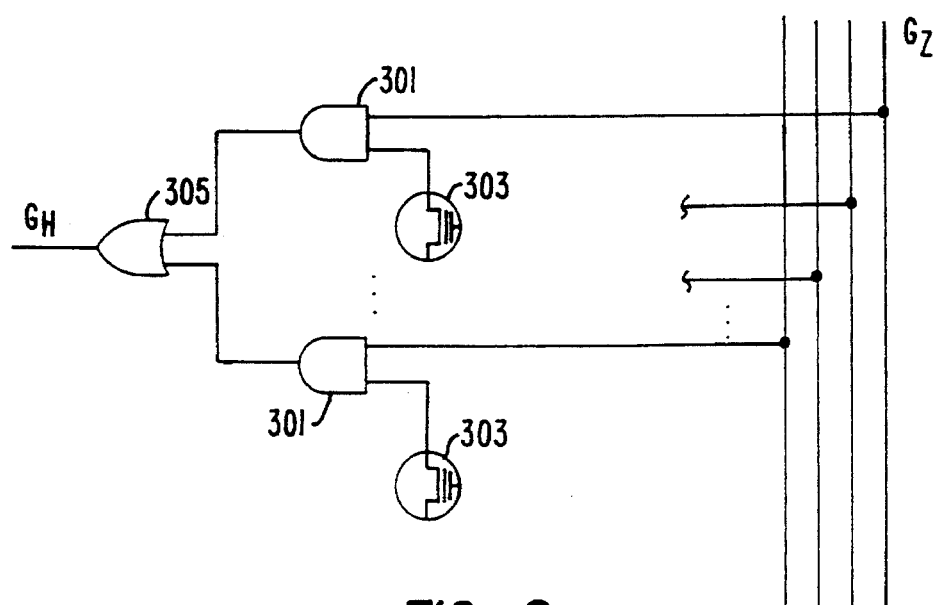
FIG. 6 illustrates an alternative GIA structure in greater detail.

FIG. 6 illustrates another circuit that may be used to transfer selected $G_Z$ signals to selected $G_H$ lines. According to this embodiment, selected $G_Z$ lines are connected to the inputs of AND gates 301. Additional inputs to the AND gates are provided via EPROM transistors 303. The outputs of the AND gates are provided as inputs to an OR gate 305, the output of which is provided to a $G_H$ line.

If the user desires for a particular $G_Z$ line to be coupled to a $G_H$ line, the EPROM transistor associated with those lines is programmed and, accordingly, the associated AND gate/OR gate will transmit the signal.

The above description is illustrative and not restrictive. Many variations of the invention will become apparent to those of skill in the art upon review of this disclosure. Merely by way of example while the invention has been described with reference to various particular techniques for interconnecting the $G_H$ and $G_Z$ lines, other techniques will be apparent based on review of this disclosure. The scope of the invention should, therefore, be determined not with reference to the above description, but instead should be determined with reference to the appended claims along with their full scope of equivalents.

What is claimed is:

1. A reprogrammable logic device in an integrated circuit comprising:

a first array of reprogrammable logic units, said first array arranged in rows and columns to form a first hemisphere;

a second array of reprogrammable logic units, said second array arranged in rows and columns to form a second hemisphere;

a first set of horizontal conductors arranged along said rows of said first array of reprogrammable logic units in said first hemisphere, said first set of horizontal conductors selectively connectable to inputs or outputs of said first array of reprogrammable logic units;

a second set of horizontal conductors arranged along said rows of said second array of reprogrammable logic units in said second hemisphere, said second set of horizontal conductors selectively connectable to inputs or outputs of said second array of reprogrammable logic units;

a first set of vertical conductors arranged along side columns of said first array of reprogrammable logic units in said first hemisphere, said first set of vertical conductors selectively connectable to said first set of horizontal conductors;

a second set of vertical conductors arranged along said columns of said second array of reprogrammable logic units in said second hemisphere, said second set of vertical conductors selectively connectable to said second set of horizontal conductors; and a plurality of global interconnect conductors between said first and second hemispheres, said global interconnect conductors selectively connectable to selected said first and said second horizontal conductors and not to said inputs or outputs of said first array of reprogrammable logic units or to said inputs or outputs of said second array of reprogrammable logic units, whereby signals in said first hemisphere may be routed to selected locations in said second hemisphere.

2. A reprogrammable logic device as recited in claim 1 wherein said first and said second arrays of reprogrammable logic units wherein logic functions of said reprogrammable units are defined by the state of SRAM memory bits.

3. A reprogrammable logic device as recited in claim 1 wherein all of said global interconnect conductors are selectively connectable to each of said first horizontal conductors.

4. A reprogrammable logic device as recited in claim 3 wherein all of said global interconnect conductors are selectively connectable to all of said second horizontal conductors.

5. A reprogrammable logic device as recited in claim 1 wherein said global interconnect conductors are selectively connectable to said first and second horizontal conductors via programmable cross point switches.

6. A reprogrammable logic device as recited in claim 5 wherein said programmable cross point switches comprise EPROM devices.

7. A reprogrammable logic device as recited in claim 1 wherein a portion of said global interconnect conductors are connectable to each of said first and second horizontal conductors.

8. A reprogrammable logic device as recited in claim 1 wherein:

first selected first and second horizontal conductors are coupled to first selected global interconnect conductors; and multiplexers are coupled to second selected global interconnect conductors for input of selected ones of said second selected global interconnect conductors to second selected first and second horizontal conductors.

9. A reprogrammable logic device as recited in claim 1 wherein:

selected global interconnect conductors are coupled to first AND gate inputs;

second AND gate inputs are coupled to EPROM transistors; and outputs of said AND gates are coupled to selected ones of said first and said second horizontal conductors.

10. A reprogrammable logic device as recited in claim 1 wherein:

selected global interconnect conductors are coupled to first AND gate inputs;

second AND gate inputs are coupled to EEPROM transistors; and outputs of said AND gates are coupled to selected ones of said first and said second horizontal conductors.

11. A reprogrammable logic device as recited in claim 5 wherein said programmable cross point switches comprise EEPROM devices.

12. A method of manufacturing programmable logic device, comprising the steps of:

providing a first array of reprogrammable logic units, said first array arranged in rows and columns to form a first hemisphere;

providing a second array of reprogrammable logic units, said second array arranged in rows and columns to form a second hemisphere;

arranging a first set of horizontal conductors along said rows of said first array of reprogrammable logic units, said first set horizontal conductors selectively connectable to inputs or outputs of said first array of reprogrammable logic units;

arranging a second set of horizontal conductors along said rows of said second array of reprogrammable logic units, said second set of horizontal conductors selectively connectable to inputs or outputs of said second array of reprogrammable logic units;

arranging a first set of vertical conductors arranged along said columns of said first array of reprogrammable logic units, said first set of vertical conductors selectively connectable to said first set of horizontal conductors;

arranging a second set of vertical conductors arranged along said column of said second array or reprogrammable logic units, said second set of vertical conductors selectively connectable to said second set of horizontal conductors; and furnishing a plurality of global interconnect conductors proximate said first and said second hemispheres, said global interconnect conductors being selectively connectable to selected ones of said first and said second horizontal conductors and not to said inputs or outputs of said first array of reprogrammable logic units or to said inputs or outputs of said second array of reprogrammable logic units, whereby signals in said first hemisphere may be routed to selected locations in said hemisphere.

13. The method of claim 12 wherein further comprising the step of controlling the logic functions in individual ones of said first and said second arrays of reprogrammable logic units by manipulating SRAM memory bits.

14. The method of claim 12 wherein said step of furnishing a plurality of global interconnect conductors further comprising the step of providing selectively connectable interconnection points between all global interconnect conductors and each of said first horizontal conductors.

15. The method of claim 14 wherein said step of furnishing a plurality of global interconnect conductors further comprising the step of providing selectively connectable interconnection points between all global interconnect conductors and each of said second horizontal conductors.

16. The method of claim 12 wherein said step of furnishing a plurality of global interconnect conductors further comprising the step of providing programmable cross point switches between said global interconnect conductors and said first and second horizontal conductors.

17. The method of claim 16 wherein said step of providing cross point switches further comprising the step of forming said programmable cross point switches out of EPROM devices.

18. The method of claim 16 wherein said step of providing cross point switches further comprising the step of forming said programmable cross point switches out of EEPROM devices.

19. The method of claim 12 wherein said step of furnishing a plurality of global interconnect conductors further comprising the step of providing selectively connectable interconnection points between a portion of said global interconnect conductors and each of said first and second horizontal conductors.

20. The method of claim 12 wherein said step of furnishing a plurality of global interconnect conductors further comprising the steps of:

coupling a first selected one of said global interconnect conductors to a first selected one of said first horizontal conductors;

coupling a second selected one of said global interconnect conductors to a first input of a multiplexer; and coupling a third selected one of said global interconnect conductors to a second input of said multiplexer; and coupling the output of said multiplexer with a second selected one of said first horizontal conductors.

21. The method of claim 12 wherein said step of furnishing a plurality of global interconnect conductors further comprising the steps of:

coupling a selected one of said global interconnect conductors to a first input of an AND gate;

coupling an EPROM transistor to a second input of said AND gate; and coupling the output of said AND gate with a selected one of said horizontal conductors.

22. The method of claim 12 wherein said step of furnishing a plurality of global interconnect conductors further comprising the steps of:

coupling a selected one of said global interconnect conductors to a first input of an AND gate;

coupling an EEPROM transistor to a second input of said AND gate; and coupling the output of said AND gate with a selected one of said first horizontal conductors.

* * * * *